(12) United States Patent
Sakuyama et al.

(10) Patent No.: US 8,314,986 B2
(45) Date of Patent: Nov. 20, 2012

(54) TRANSPARENT ELECTROMAGNETIC WAVE-SHIELDING FILTER AND METHOD OF PRODUCING THEREOF, AND CONDUCTIVE FILM

(75) Inventors: Hiroshi Sakuyama, Minami-ashigara (JP); Akira Ichiki, Minami-ashigara (JP); Hideaki Nomura, Minami-ashigara (JP)

(73) Assignee: Fujifilm Corporation, Tokyo (JP)

( * ) Notice: Subject to any disclaimer, the term of this patent is extended or adjusted under 35 U.S.C. 154(b) by 263 days.

(21) Appl. No.: 12/730,461

(22) Filed: Mar. 24, 2010

(65) Prior Publication Data

US 2010/0243923 A1 Sep. 30, 2010

(30) Foreign Application Priority Data

Mar. 25, 2009 (JP) ................. 2009-074854

(51) Int. Cl.
- G02B 5/26 (2006.01)
- G02B 5/28 (2006.01)
- G02B 5/22 (2006.01)

(52) U.S. Cl. .......... 359/360; 359/582; 359/585
(58) Field of Classification Search .......... 359/360, 359/359, 580, 589, 582, 560; 428/137, 212, 428/216, 627
See application file for complete search history.

(56) References Cited

U.S. PATENT DOCUMENTS

| | | | | |
|---|---|---|---|---|
| 4,985,312 A | * | 1/1991 | Furuya et al. | 428/627 |
| 5,464,683 A | * | 11/1995 | Rudigier et al. | 428/216 |
| 5,473,468 A | * | 12/1995 | Rudigier et al. | 359/359 |
| 5,556,694 A | * | 9/1996 | Austin | 428/212 |
| 5,571,608 A | * | 11/1996 | Swamy | 428/137 |
| 6,235,398 B1 | * | 5/2001 | Nakamura et al. | 428/432 |
| 6,252,703 B1 | * | 6/2001 | Nakamura et al. | 359/360 |
| 6,333,592 B1 | * | 12/2001 | Sasa et al. | 313/112 |
| 6,817,530 B2 | * | 11/2004 | Labrec et al. | 235/487 |
| 6,965,191 B2 | * | 11/2005 | Koike et al. | 313/112 |
| 7,396,583 B2 | * | 7/2008 | Yoshikai et al. | 428/323 |
| 2002/0159160 A1 | * | 10/2002 | Kayanoki | 359/642 |
| 2005/0068648 A1 | * | 3/2005 | Yoshikai et al. | 359/883 |
| 2007/0195404 A1 | * | 8/2007 | Iijima | 359/359 |

FOREIGN PATENT DOCUMENTS

| | | |
|---|---|---|
| JP | 2004-221564 | 8/2004 |
| JP | 2004-221565 | 8/2004 |
| JP | 2006-228469 | 8/2006 |
| JP | 2006-332459 | 12/2006 |
| JP | 2007-095408 | 4/2007 |
| JP | 2008-244067 | 10/2008 |

* cited by examiner

*Primary Examiner* — Nikita Wells
*Assistant Examiner* — Johnnie L Smith
(74) *Attorney, Agent, or Firm* — Young & Thompson

(57) ABSTRACT

A transparent electromagnetic wave-shielding filter, containing a support, a conductive layer provided on the support, and a hard coat layer provided on the conductive layer, wherein the conductive layer is formed by subjecting an emulsion layer which contains a silver halide and a binder and is coated on the support, to exposure and developing process, wherein the hard coat layer is formed by coating a coating liquid for forming the hard coat layer with a solvent on the conductive layer, and wherein the emulsion layer contains a compound soluble in the solvent of the coating liquid for forming the hard coat layer.

20 Claims, No Drawings

US 8,314,986 B2

TRANSPARENT ELECTROMAGNETIC WAVE-SHIELDING FILTER AND METHOD OF PRODUCING THEREOF, AND CONDUCTIVE FILM

FIELD OF THE INVENTION

The present invention relate to a transparent electromagnetic wave-shielding filter and a method of producing thereof, and also a conductive film for the transparent electromagnetic wave-shielding filter. More specifically, the present invention relate to a transparent electromagnetic wave-shielding filter to be used in a plasma display.

BACKGROUND OF THE INVENTION

In recent years, conductive films obtained by various production methods have been investigated (see, for example, JP-A-2000-13088 ("JP-A" means unexamined published Japanese patent application), JP-A-10-340629, JP-A-10-41682, JP-B-42-23746 ("JP-B" means examined Japanese patent publication), and JP-A-2006-228649). Among these conductive films, there are silver salt-basis conductive films produced by a method in which a silver halide emulsion layer is coated and then pattern-exposed so that a pattern shape having a conductive portion of silver for providing conductivity and an opening portion for ensuring transparency can be formed (see, for example, JP-A-2004-221564, JP-A-2004-221565, JP-A-2007-95408, JP-A-2006-228469, JP-A-2006-332459, and JP-A-2008-244067). These silver salt-basis conductive films are aimed at being applied to electromagnetic wave-shielding filters. For this reason, in general, conductive films having a low surface resistance are desired. Practically, plating or the like is used in order to lower surface resistance.

SUMMARY OF THE INVENTION

The present invention resides in a transparent electromagnetic wave-shielding filter, comprising a support, a conductive layer provided on the support, and a hard coat layer provided on the conductive layer,
wherein the conductive layer is formed by subjecting an emulsion layer which contains a silver halide and a binder and is coated on the substrate, to exposure and developing process,
wherein the hard coat layer is formed by coating a coating liquid for forming the hard coat layer with a solvent on the conductive layer, and
wherein the emulsion layer contains a compound soluble in the solvent of the coating liquid for forming the hard coat layer.

Further, the present invention resides in a method of producing a transparent electromagnetic wave-shielding filter, comprising the steps of:
forming a conductive layer by subjecting an emulsion layer which contains a silver halide and a binder and is coated on a support, to exposure and developing process; and
forming a hard coat layer by coating a coating liquid for forming a hard coat layer with a solvent on the conductive layer;
wherein the emulsion layer contains a compound soluble in the solvent of the coating liquid for forming the hard coat layer.

Further, the present invention resides in a conductive film for a transparent electromagnetic wave-shielding filter, comprising a support and a conductive layer provided on the support, wherein the conductive film is used as a transparent electromagnetic wave-shielding filter by providing a hard coat layer on the conductive layer,
wherein the conductive layer is formed by subjecting an emulsion layer which contains a silver halide and a binder and is coated on the support, to exposure and developing process,
wherein the hard coat layer is formed by coating a coating liquid for forming the hard coat layer with a solvent on the conductive layer, and
wherein the emulsion layer contains a compound soluble in the solvent of the coating liquid for forming the hard coat layer.

Other and further features and advantages of the invention will appear more fully from the following description.

DETAILED DESCRIPTION OF THE INVENTION

When a conductive film is used for an electromagnetic wave-shielding filter for a plasma display, it is necessary to further process the conductive film. The present inventors have studied and researched a processing method in which a hard coat liquid is directly coated on a conductive film. However, it has been found that when the hard coat liquid is coated on the conductive film produced by using a silver halide emulsion, adhesion properties between the conductive film and the hard coat layer are insufficient.

As a result of intensive studies, the present inventors have found that the above-described problems can be dissolved by adding a compound easily soluble in a solvent of a hard coat liquid to a silver salt emulsion layer. Based on this finding, the present invention has been completed.

According to the present invention, there is provided the following means:

(1) A transparent electromagnetic wave-shielding filter, comprising a support, a conductive layer provided on the support, and a hard coat layer provided on the conductive layer,
wherein the conductive layer is formed by subjecting an emulsion layer which contains a silver halide and a binder and is coated on the support, to exposure and developing process,
wherein the hard coat layer is formed by coating a coating liquid for forming the hard coat layer with a solvent on the conductive layer, and
wherein the emulsion layer contains a compound soluble in the solvent of the coating liquid for forming the hard coat layer.
(2) The transparent electromagnetic wave-shielding filter as described in the above item (1), wherein the solvent is at least one solvent selected from the group consisting of ketones, esters and alcohols.
(3) The transparent electromagnetic wave-shielding filter as described in the above items (1) or (2), wherein the content of the compound soluble in the solvent of the coating liquid for forming the hard coat layer is 6% by volume or more relative to the emulsion layer as a whole.
(4) The transparent electromagnetic wave-shielding filter as described in any one of the above items (1) to (3), wherein the compound soluble in the solvent is silicone oil or paraffinic oil.
(5) The transparent electromagnetic wave-shielding filter as described in the above item (4), wherein the content of the silicone oil or paraffinic oil in the emulsion layer is 20 to 300 mg/m$^2$.
(6) The transparent electromagnetic wave-shielding filter as described in any one of the above items (1) to (5), wherein center value of particle size distribution of the compound soluble in the solvent is from 0.01 μm to 10 μm.

(7) The transparent electromagnetic wave-shielding filter as described in any one of the above items (4) to (6), wherein polymerization degree of polysiloxane contained as a component of the silicone oil is from 2 to 100.

(8) The transparent electromagnetic wave-shielding filter as described in any one of the above items (4) to (6), wherein the number of carbon atoms of paraffin-base hydrocarbon contained as a component of the paraffinic oil is from 2 to 1000.

(9) The transparent electromagnetic wave-shielding filter as described in any one of the above items (1) to (8), wherein the binder contained in the emulsion layer is gelatin.

(10) A method of producing a transparent electromagnetic wave-shielding filter, comprising the steps of:

forming a conductive layer by subjecting an emulsion layer which contains a silver halide and a binder and is coated on a support, to exposure and developing process; and forming a hard coat layer by coating a coating liquid for forming a hard coat layer with a solvent on the conductive layer;

wherein the emulsion layer contains a compound soluble in the solvent of the coating liquid for forming the hard coat layer.

(11) A conductive film for a transparent electromagnetic wave-shielding filter, comprising a support and a conductive layer provided on the substrate, wherein the conductive film is used as a transparent electromagnetic wave-shielding filter by providing a hard coat layer on the conductive layer, wherein the conductive layer is formed by subjecting an emulsion layer which contains a silver halide and a binder and is coated on the support, to exposure and developing process, wherein the hard coat layer is formed by coating a coating liquid for forming the hard coat layer with a solvent on the conductive layer, and wherein the emulsion layer contains a compound soluble in the solvent of the coating liquid for forming the hard coat layer.

The present invention is described in detail below.

The transparent electromagnetic wave-shielding filter of the present invention is a filter formed by directly coating a hard coat liquid on a conductive film having a conductive layer provided on a support, to thereby form a hard coat layer on the conductive layer.

<Conductive Film>

[Support]

A support to be employed for the transparent electromagnetic wave-shielding filter and the conductive film of the present invention can be, for example, a plastic film, a plastic plate or a glass plate. The thickness of the support is preferably 50 to 300 µm, more preferably 60 to 200 µm.

The support is preferably a film or plate made of a plastic having a melting point of about 290° C. or lower, such as polyethyleneterephthalate (PET) (melting point: 258° C.), polyethylenenaphthalate (PEN) (melting point: 269° C.), polyethylene (PE) (melting point: 135° C.), polypropylene (PP) (melting point: 163° C.), polystyrene (melting point: 230° C.), polyvinyl chloride (melting point: 180° C.), polyvinylidene chloride (melting point: 212° C.), or triacetyl cellulose (TAC) (melting point: 290° C.). PET is particularly preferred for the support from the viewpoint of light transmittance and workability. As transparency is required to the transparent electromagnetic wave-shielding filter, the transparency of the support is preferably high. It is preferred that the above support has a transmittance in the entire visible region of 70% to 100%, more preferably 85% to 100%, and particularly preferably 90% to 100%. Further, the support may be colored to an extent not hindering the objects of the present invention.

For the purpose of firmly adhering each layer to the support, it is preferred for both surfaces of the support to be subjected to surface activation treatment, such as chemical treatment, mechanical treatment, corona discharge treatment, flame treatment, ultraviolet treatment, high frequency treatment, glow discharge treatment, active plasma treatment, laser treatment, mixed acid treatment, and ozone oxidation treatment, in advance.

For example, when a silver halide photographic-sensitive material is manufactured by coating the coating liquid for forming silver halide photographic-sensitive layers (hereinafter sometimes referred to as "coating liquid for silver halide photosensitive layers"), for ensuring an adhering property between the support and layers, (1) a method of coating the coating liquid for silver halide photosensitive layers directly on the support after performing the surface activation treatment to obtain adhering strength, and (2) a method of, after once performing the surface activation treatment, providing an undercoat layer, and coating the coating liquid for silver halide photosensitive layers on the undercoat layer are exemplified. The method of (2) is more effective and widely carried out.

Undercoating method is described. The undercoat layer may be a single layer or may comprise two or more layers. As the binder for the undercoat layer, copolymers using monomers selected from vinyl chloride, vinylidene chloride, butadiene, methacrylic acid, acrylic acid, itaconic acid, and maleic acid anhydride as starting materials, and polyethyleneimine, epoxy resins, grafted gelatin, nitrocellulose, and gelatin are exemplified. As compounds for swelling the support, resorcin and p-chlorophenol are exemplified. As gelatin hardening agents for the undercoat layer, chromium salt (e.g., chrome alum), aldehydes (e.g., formaldehyde, glutaraldehyde), isocyanates, activated halogen compounds (e.g., 2,4-dichloro-6-hydroxy-S-triazine), epichlorohydrin resins, and active vinylsulfone compounds can be exemplified. $SiO_2$, $TiO_2$, fine particles of inorganic materials, or fine particles of polymethyl methacrylate copolymer (0.01 to 10 µm) may be contained as a matting agent.

[Conductive Layer (Emulsion Layer)]

The conductive film constituting the transparent electromagnetic wave-shielding filter of the present invention has a conductive layer on the support. The conductive layer is formed by subjecting an emulsion layer containing a silver halide and a binder (silver salt-containing light-sensitive layer) coated on the support to exposure using a specifically shaped mesh pattern and developing process. In other words, the conductive film is formed by using a conductive film-forming light-sensitive material having an emulsion layer. The conductive layer in the present invention is a layer containing a mesh-like formed conductive layer and an opening portion other than the conductive portion.

The emulsion layer may contain an additive such as a solvent and a dye, in addition to the silver salt and the binder. The emulsion layer may be composed of a single layer or two or more layers. The thickness of the emulsion layer is preferably 0.05 µm to 20 µm, and more preferably 0.1 µm to 10 µm.

In the conductive film-forming light-sensitive material, the emulsion layer is substantially laid on the topmost layer. The term "the emulsion layer is substantially laid on the topmost layer" means not only a case where the emulsion layer is actually laid as the topmost layer but also a case where a layer(s) having total film thickness of 0.5 µm or less is laid on the emulsion layer. The total film thickness of the layer(s) laid on the emulsion layer is preferably 0.2 µm or less.
(Silver Salt)

Examples of the silver salt used in the present invention include an inorganic-silver salt such as a silver halide, and an organic-silver salt such as silver acetate. In the present invention, it is preferable to employ silver halide superior in a property as a photosensor, and technologies of a silver salt photographic film, a photographic paper, a lithographic film, and an emulsion mask for a photomask relating to silver halide are applicable also in the present invention. The amount of the silver salt to be coated in the silver salt-containing emulsion layer is not particularly limited, and it is preferably from 0.1 to 40 g/m$^2$, particularly preferably from 0.5 to 25 g/m$^2$, in terms of silver. The lower limit thereof is preferably 3 g/m$^2$, more preferably 5 g/m$^2$, and particularly preferably 7 g/m$^2$.
(Binder)

In the emulsion layer, a binder is used to disperse the silver salt particles evenly and to aid the adhesion between the emulsion layer and the support. In the present invention, although both water-insoluble polymer and water-soluble polymer may be used as the binder, it is preferable to use a water-soluble polymer.

Examples of the binder include gelatin, polyvinyl alcohol (PVA), polyvinyl pyrrolidone (PVP), polysaccharides such as starch, cellulose and derivatives thereof, polyethylene oxide, polysaccharide, polyvinyl amine, chitosan, polylysine, polyacrylic acid, polyalginic acid, polyhyaluronic acid, carboxycellulose. These materials have a neutral, anionic or cationic property depending on the ionic property of the functional group.

In the present invention, it is especially preferable to use gelatin.

The amount of the binder contained in the emulsion layer is not particularly restricted, and can be suitably selected within a range of meeting the dispersibility and the adhesion. As for the binder content in the emulsion layer, the ratio by volume of Ag to the binder is preferably 1/10 or more, more preferably 1/4 or more, further preferably 1/2. The upper limit thereof is preferably 5/1, more preferably 3/1.
(Solvent)

A solvent to be employed in forming the emulsion layer is not particularly limited, and can be, for example, water, an organic solvent (for example, alcohols such as methanol, ketones such as acetone, amides such as formamide, sulfoxides such as dimethyl sulfoxide, esters such as ethyl acetate, or ethers), an ionic liquid or a mixture thereof.

The content of the solvent to be used in the emulsion layer of the present invention is in the range of 30 to 90% by mass with respect to the total mass of the silver salt, the binder and the like contained in the emulsion layer, preferably in the range of 50 to 80% by mass.
(Compound Soluble in Solvent of Coating Liquid for Forming Hard Coat Layer)

In the present invention, the emulsion layer (conductive layer) contains a compound soluble in the solvent of the coating liquid for forming the hard coat layer as described below. By incorporating the compound soluble in the solvent of the coating liquid for forming the hard coat layer in the emulsion layer, adhesion properties between the conductive layer and the hard coat layer disposed thereon are improved in the wave-shielding filter of the present invention. Though this reason is uncertain, the present inventors suppose as follows. Namely, the emulsion layer is subjected to exposure using a specifically shaped mesh pattern and developing process, thereby forming a conductive portion formed in a mesh pattern and an opening portion other than the conductive portion. It is supposed that in the opening portion in particular, the compound soluble in the solvent of the coating liquid for forming the hard coat layer becomes in the dispersion state, and when a coating liquid for forming a hard coat is coated on the conductive layer, the compound is dissolved in the solvent of the coating liquid for forming the hard coat layer and gets out of the opening portion, and as a result, a coating liquid for forming a hard coat gets through the portion that the compound was present in the conductive layer whereby adhesion is improved (due to an anchor effect). It is supposed that the anchor effect at the opening portion contributes to improvement in adhesion, because areas of the opening portion are larger than the conductive portion.

Herein, the term "a compound soluble in a solvent" means a compound to be dissolved, for example, in a quantity of 0.01 g or more, more preferably 0.1 g or more, further preferably 0.5 g or more and especially preferably 1 g or more, relative to 100 g of a solvent of the coating liquid for forming a hard coat layer at 25° C.

Examples of the compound soluble in the solvent of the coating liquid for forming the hard coat layer that is used in the present invention include silicone oil, paraffinic oil and (meth)acrylic particles. Among these compounds, silicone oil and paraffinic oil are particularly preferable.

As the silicone oil, a compound in which the polymerization degree of polysiloxane contained as a component of the silicone oil is preferably from 2 to 100, and more preferably from 5 to 20 is favorably used. As the paraffinic oil, a compound in which the number of carbon atoms of paraffin-base hydrocarbon contained as a component of the paraffinic oil is from 2 to 1,000, and more preferably from 5 to 100 is favorably used.

In the present invention, as the compound soluble in the solvent of the coating liquid for forming the hard coat layer, a compound in which center value of particle size distribution is from 0.01 to 10 µm is preferable. When the compound is silicone oil, the center value of particle size distribution thereof is preferably from 0.01 to 0.5 µm. When the compound is paraffinic oil, the center value of particle size distribution thereof is preferably from 0.05 to 5 µm. When the compound is (meth)acrylic particles, the center value of particle size distribution thereof is preferably from 0.1 to 10 µm, and more preferably from 0.5 to 5 µm. The center value of particle size distribution can be measured using a centrifugal separation method, a laser-diffraction/scattering method, an X-ray transmission method, an electric resistance method or a sieve method. Among these methods, a laser-diffraction/scattering method is preferable. The laser-diffraction/scattering method can be performed using LA-910 Laser Scattering Particle Size Distribution Analyzer (manufactured by HORIBA, Ltd.).

In the present invention, the compound soluble in the solvent of the coating liquid for forming the hard coat layer is contained in an emulsion layer in an amount of preferably 2% by volume or more, more preferably 3% by volume or more, and further preferably 6% by volume or more, relative to the emulsion layer as a whole. The content of the compound is preferably from 2 to 50% by volume, more preferably from 6 to 25% by volume, further preferably from 7 to 25% by volume in the case of silicone oil or paraffinic oil, and in this case, from the viewpoint of the condition of coated face of the film, the content of the compound is preferably 20% by volume or less. The content of the compound is preferably from 5 to 60% by volume in the case of (meth)acrylic particles.

When two or more emulsion layers are present, it is preferable that the compound is contained in an outermost emulsion layer closest to the hard coat layer. In this case, the compound is contained in the outermost emulsion layer in an amount of preferably 2% by volume or more, and more preferably 3% by volume or more, and further preferably 6% by volume or more, relative to the emulsion layer as a whole. The content of the compound is preferably from 2 to 50% by volume, more preferably from 6 to 25% by volume, further preferably from 7 to 25% by volume in the case of silicone oil or paraffinic oil, and in this case, from the viewpoint of the condition of coated face of the film, the content of the compound is preferably 20% by volume or less. The content of the compound is preferably 5 to 60% by volume in the case of (meth)acrylic particles.

Further, the compound soluble in the solvent of the coating liquid for forming the hard coat layer that is used in the present invention is contained in an emulsion layer in an amount of preferably 20 mg/m$^2$ or more, more preferably from 20 to 300 mg/m$^2$, and further preferably from 50 to 300 mg/m$^2$ in the case of silicone oil or paraffinic oil; and it is preferably 50 to 1100 mg/m$^2$ in the case of (meth)acrylic particles.

Silicone oil, paraffinic oil, (meth)acrylic particles, or the like may be contained in the emulsion layer in such a manner that they meet the requirements described above. It is supposed that these compounds dissolve out of the emulsion layer and move to the hard coat layer whereby adhesion is improved. An improvement effect on adhesion is not necessarily limited to this mechanism. A conductive film-forming light-sensitive material having an emulsion layer in which silicone oil, paraffinic oil, (meth)acrylic particles, or the like is contained may be used for an electrode, a circuit wiring, a transparent conductive film, in addition to an electromagnetic shield.

(Other Additives)

Various additives to be employed in the present invention are not particularly limited, and any additive can be employed advantageously. Examples thereof include a thickener, an antioxidant, a matting agent, a lubricant, an antistatic agent, a nucleating agent, a spectral sensitizing dye, a surfactant, an antifog agent, a hardener, a black-spot inhibitor.

[Other Layer Structures]

In the conductive film constituting the transparent electromagnetic wave-shielding filter of the present invention, a protective layer may be formed on the emulsion layer. In the present invention, the "protective layer" means a layer made from a binder such as gelatin or a polymer, and is formed on the emulsion layer having photosensitivity, for the purposes of preventing scratches and improving mechanical characteristics. The thickness of the protective layer is preferably 0.2 µm or less. A coating method and a forming method of the protective layer are not particularly limited, and a known coating method and forming method can be appropriately selected. Below the emulsion layer, for example, an undercoating layer may be laid.

[Production of Conductive Film]

The conductive film used in the present invention is obtained by subjecting the emulsion layer provided on the support to mesh pattern-exposure and developing process. In the present invention, examples of the mesh patterns that are formed by pattern exposure and developing process include a rectilinear grid pattern having a mesh-like form in which lines are nearly orthogonal, and a wavy line grid pattern in which a conductive portion between crossings has at least one curvature. In the present invention, the pitch of mesh pattern of the conductive layer (the total of a line width of the conductive portion and a width of the opening portion) is preferably 600 µm or less, and more preferably 400 µm or less. The low limit of the pitch is preferably 100 µm or more. The line width of the conductive portion is preferably 30 µm or less, and more preferably from 1 µm to 20 µm. If the line width becomes wider, while a conductive film becomes excellent in conductivity, there is a possibility that adhesion properties between the conductive film and a hard coat layer adjacent thereto become lower. In contrast, if the line width is too narrow, conductivity tends to be insufficient.

In the present invention, a transparent conductive layer having a high resistance may be formed by further coating a conductive polymer on the conductive layer within a range whereby conductivity is secured.

(Exposure)

A pattern-exposure of the emulsion layer can be performed by a planar exposure using a photomask, or by a scanning-exposure with a laser beam. A refractive exposure employing a lens or a reflective exposure employing a reflecting mirror may be employed, and a contact exposure, a proximity exposure, a reduced projection exposure or a reflective projection exposure may be used.

(Developing Treatment)

After pattern-exposure is performed as mentioned above, the emulsion layer is further subjected to a developing process. As for the developing process, it is possible to use an ordinary developing process technique that is used for a silver salt photographic film, a photographic paper, lithographic films, emulsion masks for photomask, or the like.

In the present invention, the aforementioned pattern-exposure and developing process are conducted, whereby a conductive portion (metal silver portion) having a mesh pattern is formed in the exposed portion, and also an opening portion (light-transmitting portion) is formed in the unexposed portion. The developing process of the emulsion layer may include a fixing process conducted to remove the silver salt in the unexposed portion and attain stabilization. In the fixing process of the emulsion layer, there may be used any technique of the fixing process used for silver salt photographic films, photographic paper, lithographic films, emulsion masks for photomasks, and the like.

<Transparent Electromagnetic Wave-Shielding Filter>

The transparent electromagnetic wave-shielding filter of the present invention has a conductive layer and a hard coat layer provided thereon by directly coating a hard coat liquid on the conductive film.

[Hard Coat Layer]

(Solvent)

In the present invention, preferable examples of the solvent of the coating liquid for forming a hard coat layer include ketones, esters and alcohols. Among these solvents, ketones are especially preferable. Specific examples of the ketones include methyl ethyl ketone, diethyl ketone, methyl isobutyl ketone, and cyclohexanone. Among these ketones, methyl ethyl ketone is preferable.

The content of the solvent in the hard coat-forming liquid is preferably from 10% by mass to 95% by mass.

(Ionizing Radiation-Curable Compound)

In the present invention, preferable examples of the ionizing radiation-curable compound used for forming the hard coat layer include photo polymerizable, electron beam-polymerizable, or radiation-polymerizable multi-functional monomers and multi-functional oligomers. Among these compounds, photo polymerizable monomers and oligomers are especially preferable. The ionizing radiation-curable compound is polymerized and cured to form a cured film (hard coat layer).

The content of the ionizing radiation-curable compound in the hard coat-forming liquid is preferably from 0.1% by mass to 95% by mass.

(Polymerization Initiator)

In the present invention, preferable examples of the polymerization initiator used for forming the hard coat layer include a light-induced radical polymerization initiator and a light-induced cation polymerization initiator. Of these initiators, a light-induced radical polymerization initiator is especially preferable.

The content of the polymerization initiator in the hard coat-forming liquid is preferably from 0.1 to 10% by mass relative to the ionizing radiation-curable compound.

[Formation of Hard Coat Layer]

The hard coat layer in the transparent electromagnetic wave-shielding filter of the present invention can be formed by directly coating the hard coat liquid on the conductive film, followed by drying and exposing the hard coat layer to UV light.

The thickness of the hard coat layer is preferably from 0.1 µm to 50 µm, and more preferably from 1 µm to 20 µm.

The coating of each layer can be performed by an ordinary method such as roll coating, bar coating, gravure coating, gravure reverse coating, die coating, slide coating, or curtain coating.

For the above-mentioned transparent electromagnetic wave-shielding filter and conductive film of the present invention, any appropriate combination of two or more selected from known documents listed up below may be used.

JP-A-2004-221564, JP-A-2004-221565, JP-A-2007-200922, JP-A-2006-352073, WO 2006/001461, JP-A-2007-129205, JP-A-2007-235115, JP-A-2007-207987, JP-A-2006-012935, JP-A-2006-010795, JP-A-2006-228469, JP-A-2006-332459, JP-A-2007-207987, JP-A-2007-226215, WO 2006/088059, JP-A-2006-261315, JP-A-2007-072171, JP-A-2007-102200, JP-A-2006-228473, JP-A-2006-269795, JP-A-2006-267635, WO 2006/098333, JP-A-2006-324203, JP-A-2006-228478, JP-A-2006-228836, WO 2006/098336, WO 2006/098338, JP-A-2007-009326, JP-A-2006-336090, JP-A-2006-336099, JP-A-2006-348351, JP-A-2007-270321, JP-A-2007-270322, WO 2006/098335, JP-A-2007-201378, JP-A-2007-335729, WO 2006/098334, JP-A-2007-134439, JP-A-2007-149760, JP-A-2007-208133, JP-A-2007-178915, JP-A-2007-334325, JP-A-2007-310091, 2007-116137, JP-A-2007-088219, JP-A-2007-207883, JP-A-2007-013130, WO 2007/001008, JP-A-2005-302508, JP-A-2008-218784, JP-A-2008-227350, JP-A-2008-227351, JP-A-2008-244067, JP-A-2008-267814, JP-A-2008-270405, JP-A-2008-277675, JP-A-2008-277676, JP-A-2008-282840, JP-A-2008-283029, JP-A-2008-288305, JP-A-2008-288419, JP-A-2008-300720, JP-A-2008-300721, JP-A-2009-4213, JP-A-2009-10001, JP-A-2009-16526, JP-A-2009-21334, JP-A-2009-26933, JP-A-2008-147507, JP-A-2008-159770, JP-A-2008-159771, JP-A-2008-171568, JP-A-2008-198388, JP-A-2008-218096, JP-A-2008-218264, JP-A-2008-224916, JP-A-2008-235224, JP-A-2008-235467, JP-A-2008-241987, JP-A-2008-251274, JP-A-2008-251275, JP-A-2008-252046, JP-A-2008-277428, and JP-A-2009-21153.

According to the present invention, there is provided a transparent electromagnetic wave-shielding filter excellent in adhesion properties between the conductive film and the hard coat layer, and a method of producing thereof; and a conductive film for the transparent electromagnetic wave-shielding filter.

The transparent electromagnetic wave-shielding filter of the present invention is excellent in adhesion properties between the conductive film and the hard coat layer, whereby this filter can be favorably used for, for example, a plasma display.

The present invention will be described in more detail based on the following examples, but the invention is not intended to be limited thereto.

EXAMPLES

Example 1

Production of Conductive Film Sample 1

(Preparation of Emulsion A)
Solution 1:

| Water | 750 ml |
|---|---|
| Gelatin | 20 g |
| Sodium chloride | 3 g |
| 1,3-Dimethylimidazolidine-2-thione | 20 mg |
| Sodium benzenethiosulfonate | 10 mg |
| Citric acid | 0.7 g |

Solution 2:

| Water | 300 ml |
|---|---|
| Silver nitrate | 150 g |

Solution 3:

| Water | 300 ml |
|---|---|
| Sodium chloride | 38 g |
| Potassium bromide | 32 g |
| Potassium hexachloroiridate (III) (0.005% in 20% aqueous KCl solution) | 5 ml |
| Ammonium hexachlororhodate (0.001% in 20% aqueous NaCl solution) | 7 ml |

The potassium hexachloroiridate (III) (0.005% in 20% aqueous KCl solution) and ammonium hexachlororhodate (0.001% in 20% aqueous NaCl solution) used in Solution 3 were prepared by dissolving powders thereof in a 20% aqueous solution of KCl and a 20% aqueous solution of NaCl, respectively, and heating the solutions at 40° C. for 120 minutes.

To solution 1, while the temperature and the pH of which were kept at 38° C., pH 4.5, solutions 2 and 3 (amounts corresponding to 90% of the respective solution amounts) were added simultaneously over a period of 20 minutes with being stirred. In this way, nucleus particles of 0.16 µm in size were formed. Subsequently, the following solutions 4 and 5 were added thereto over a period of 8 minutes, and the rests of the solutions 2 and 3 (amounts corresponding to 10% of the respective solution amounts) were further added thereto over a period of 2 minutes so as to cause the particles to grow up to 0.21 µm in size. Furthermore, 0.15 g of potassium iodide was added thereto, and the resultant was aged for 5 minutes to end the formation of the particles.

Solution 4:

| | |
|---|---|
| Water | 100 ml |
| Silver nitrate | 50 g |

Solution 5:

| | |
|---|---|
| Water | 100 ml |
| Sodium chloride | 13 g |
| Potassium bromide | 11 g |
| Potassium ferrocyanide | 5 mg |

Thereafter, washing with water by the flocculation method according to the ordinary method was conducted. Specifically, the temperature was lowered to 35° C., and 3 g of anionic precipitation agent-1 shown below was added, and then pH was reduced using sulfuric acid until silver halide precipitated (precipitation occurred in the pH range of 3.2±0.2).

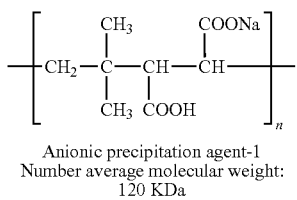

Anionic precipitation agent-1
Number average molecular weight:
120 KDa

About 3 L of the supernatant was then removed (first water washing). Further, 3 L of distilled water was added to the mixture, and sulfuric acid was added until silver halide precipitated. 3 L of the supernatant was removed again (second water washing). The procedure same as the second water washing was repeated once more (third water washing), and water-washing and desalting steps were thus completed.

To the emulsion after washing and desalting, 30 g of gelatin was added, and then pH and pAg were adjusted to 5.6 and 7.5, respectively. Thereto, 10 mg of sodium benzenethiosulfonate, 3 mg of sodium benzenethiosulfinate, 15 mg of sodium thiosulfate, and 10 mg of chloroauric acid were added, and the mixture was thus subjected to chemical sensitization to obtain the optimal sensitivity at 55° C. Then, 100 mg of 1,3,3a,7-tetrazaindene as a stabilizing agent, and 100 mg of Proxel (trade name, manufactured by ICI Co., Ltd.) as an antiseptic were added. Finally, a silver iodochlorobromide cubic particle emulsion containing 70 mol % of silver chloride and 0.08 mol % of silver iodide and having an average particle diameter of 0.22 μm and a coefficient of variation of 9% was obtained. The emulsion had finally a pH of 5.7, a pAg of 7.5, an electrical conductivity of 40 μS/m, a density of $1.2 \times 10^{-3}$ kg/m$^3$, and a viscosity of 60 mPa·s.

(Production of Sample 1)

On a polyethylene terephthalate support both surfaces of which were provided with moisture barrier undercoat layers containing vinylidene chloride shown below, UL layer/emulsion layer were coated in this order from the support to produce a sample 1. The preparation method, the coating amount and the coating method of each layer are described below.

<Emulsion Layer>

To the emulsion A, 100 mg/m$^2$ of the following silicone oil (center value of particle size distribution: 0.18 μm, manufactured by Shin-Etsu Chemical Co., Ltd.) and a coating aid were added to prepare a coating liquid. Then, the pH of the coating liquid was adjusted to 5.6 using citric acid. The thus-prepared emulsion layer-coating liquid was coated on the following support so that the coating amounts of Ag and gelatin were 7.6 g/m$^2$ and 1.0 g/m$^2$, respectively.

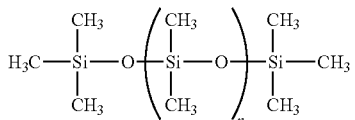

n = 10 to 15

<UL Layer>

| | |
|---|---|
| Gelatin | 0.2 g/m$^2$ |
| Compound (Cpd-7) | 40 mg/m$^2$ |
| Compound (Cpd-14) | 10 mg/m$^2$ |
| Antiseptic (Proxel) | 1.5 mg/m$^2$ |

Cpd-7

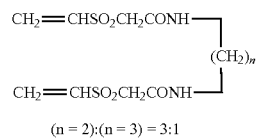

(n = 2):(n = 3) = 3:1

Cpd-14

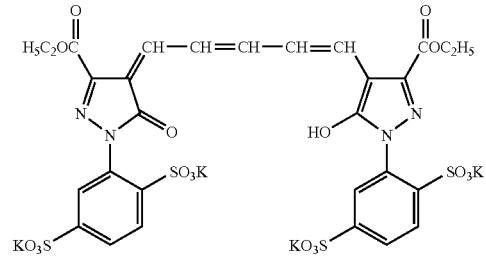

In addition, to a coating liquid for each layer, the following thickener Z was added to adjust viscosity of the coating liquid.

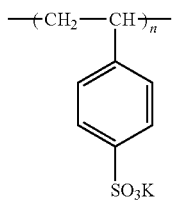

Thickener Z

<Support>

On both surfaces of the biaxially-stretched polyethylene terephthalate support (thickness: 100 μm), a coating liquid for forming a first undercoat layer and a coating liquid for forming a second undercoat layer each having the following composition respectively were coated.

<Coating Liquid for Forming First Undercoat Layer>

| | |
|---|---|
| Core/shell type vinylidene chloride copolymer (1) | 15 g |
| 2,4-dichloro-6-hydroxy-s-triazine | 0.25 g |
| Compound (Cpd-20) | 0.20 g |
| Water | up to 100 g |

Furthermore, the pH of the coating liquid was adjust to 6 by adding thereto a 10% by mass KOH aqueous solution, and then the coating liquid was coated so that a dried thickness was 0.9 μm as a result of drying at a drying temperature of 180° C. for 2 minutes.

<Coating Liquid for Forming Second Undercoat Layer>

| | |
|---|---|
| Gelatin | 1 g |
| Methylcellulose | 0.05 g |
| Compound (Cpd-21) | 0.02 g |
| $C_{12}H_{25}O(CH_2CH_2O)_{10}H$ | 0.03 g |
| Proxel (trade name, manufactured by ICI Co., Ltd.) | $3.5 \times 10^{-3}$ g |
| Acetic acid | 0.2 g |
| Water | up to 100 g |

This coating liquid was coated so that a dried thickness was 0.1 μm as a result of drying at a drying temperature of 170° C. for 2 minutes.

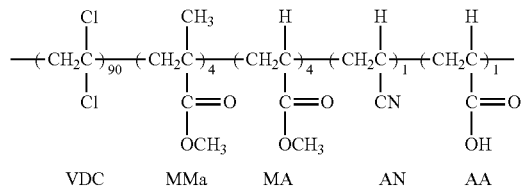

Core: VDC/MMA/MA (80% by mass)
Shell: VDC/AN/AA (20% by mass)
Average particle size: 70 nm
Core/shell type vinylidene chloride copolymer (1)

Compound (Cpd-20)

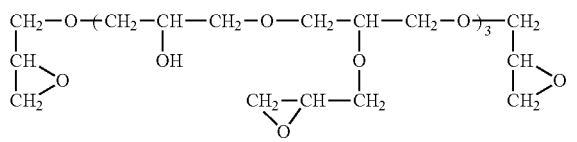

Compound (Cpd-21)

HO[CO(CH₂)₄CONH(CH₂)₂N(CH₂)₂NH]H•HCl

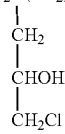

<Coating Method>

First as for the emulsion-coating side, in the following order, a UL layer and an emulsion layer were formed on the above-described undercoat layers provided on the surface of a support according to a simultaneous multilayer coating method and using a slide bead coater method while keeping at 35° C. and adding to these layers a hardener-containing fluid, and then the resulting coatings were gotten through a cold air set zone (5° C.). Next, in the following order, a conductive layer and a back layer were formed on the surface of the substrate opposite to the emulsion-coating side according to a simultaneous multilayer coating method using a curtain coater method while adding to these layers a hardener-containing fluid, and then the resulting coatings were gotten through a cold air set zone (5° C.). At the time when the coatings were gotten through each cold air set zone, the coating liquid showed sufficient setting properties. Continuously, both surfaces of the coatings were dried at the same time.

(Exposure and Developing Process)

The thus-dried coating film was exposed through a lattice-like pattern using a image setter FT-RS055 (trade name, manufactured by Dainippon Screen Mfg. Co., Ltd.) so as to provide a developed silver image having line/space=15 μm/285 μm (pitch: 300 μm). In this time, the exposure amount was optimally adjusted according to each sample.

Each exposed sample was processed with the developer (A) and the fixer (B) each having the following compositions under the development condition of 35° C. and 30 seconds using an auto processor FG-680 AG (trade name, manufactured by FUJIFILM CORPORATION.).

[Composition of Developer (A)]

The following amount of each composition indicates an amount per liter of concentrated liquid.

| | |
|---|---|
| Potassium hydroxide | 60.0 g |
| Diethylenetriaminepentaacetic acid | 3.0 g |
| Potassium carbonate | 90.0 g |
| Sodium metabisulfite | 105.0 g |
| Potassium bromide | 10.5 g |
| Hydroquinone | 60.0 g |
| 5-methyl-benzotriazole | 0.53 g |
| 4-hydroxymethyl-4-methyl-1-phenyl-3-pyrazolidone | 2.3 g |
| Sodium 3-(5-mercaptotetrazole-1-yl) benzene sulfonate | 0.15 g |
| Sodium 2-mercapto-5-benzimidazolesulfonate | 0.45 g |
| Sodium erythorbate | 9.0 g |
| Diethylene glycol | 7.5 g |
| pH | 10.79 |

For the use of the developer, a mother liquid was prepared by diluting the above-described concentrated liquid with water in the proportion of 1 part of water relative to 2 parts of the concentrated liquid. The pH of the mother liquid was 10.65. A replenisher was prepared by diluting the concentrated liquid with water in the proportion of 3 parts of water relative to 4 parts of the concentrated liquid. The pH of the replenisher was 10.62.

[Composition of Fixer (B)]

The following amount of each composition indicates an amount per liter of concentrated liquid.

| | |
|---|---|
| Ammonium thiosufate | 360 g |
| Disodium ethylenediaminetetraacetate dihydrate | 0.09 g |
| Sodium thiosulfate pentahydrate | 33.0 g |
| Sodium methasulfite | 57.0 g |
| Sodium hydroxide | 37.2 g |
| Acetic acid (100%) | 90.0 g |
| Tartaric acid | 8.7 g |
| Sodium gluconate | 5.1 g |
| Aluminum sulfate | 25.2 g |
| pH | 4.85 |

For the use of the fixer, a working solution was prepared by diluting the above-described concentrated liquid with water in the proportion of 2 parts of water relative to 1 part of the concentrated liquid. The pH of the working solution was 4.8. A replenisher that was prepared by diluting the concentrated liquid with water in the same proportion as the working solution was used in a quantity of 258 ml per m² of photosensitive material.

(Plating Process)

Continuously, the film having thereon a mesh pattern silver image obtained by the above-described developing process was immersed in an activation solution and an electroless copper plating solution each having the following composition whereby electroless copper plating was performed on the mesh pattern silver image. Herein, the activation process was carried out at 35° C. for 5 minutes. Meanwhile, the electroless copper plating was continued at 35° C. for the period of time until surface resistivity reached to 0.3Ω/□ or less.

(Composition of Activation Solution): Per Liter

| PdCl$_2$ | 0.2 g |
| HCl (2-normal aqueous solution) | 25.6 ml |

Water was added to dissolve the above-described components and to make 1 liter.

(Composition of Electroless Copper Plating Solution)

| Cupric sulfate | 0.06 mol/L |
| Formalin | 0.22 mol/L |
| Triethanolamine | 0.12 mol/L |
| Polyethylene glycol | 100 ppm |
| Yellow prussiate of potash | 50 ppm |
| Solution containing 20 ppm of α,α'-bipyridine | | pH = 12.5

A light-transmissive conductive film having a metal fine line portion and a light-transmissive portion containing substantially no metal was formed by subjecting each sample to the above-described exposure, development and plating. In these films, the metal fine line portion presented a mesh pattern in accordance with an exposure pattern. The line/space width was 15 μm/285 μm in each sample. Further, the opening rate of the light-transmissive portion was about 90% in each sample.

[Production of Conductive Film Sample 2]

Sample 2 was produced in the same manner as sample 1, except that the addition amount of the silicone oil was changed to 50 mg/m$^2$.

[Production of Conductive Film Sample 3]

Sample 3 was produced in the same manner as sample 1, except that the addition amount of the silicone oil was changed to 25 mg/m$^2$.

[Production of Conductive Film Sample 4]

Sample 4 was produced in the same manner as sample 1, except that the addition amount of the silicone oil was changed to 150 mg/m$^2$.

[Production of Conductive Film Sample 5]

Sample 5 was produced in the same manner as sample 1, except that the addition amount of the silicone oil was changed to 200 mg/m$^2$.

[Production of Conductive Film Samples 6 to 8]

Samples 6 to 8 were produced in the same manner as samples 1 to 3, except that the silicone oil in each of these samples was changed to the following liquid paraffin (center value of particle size distribution: 1.8 μm, manufactured by ISP Inc.) respectively.

—(CH$_2$)$_n$— ($n$=15 to 50)

[Production of Conductive Film Sample 9]

Sample 9 was produced in the same manner as sample 1, except that the silicone oil was changed to poly(methyl methacrylate) (PMMA) particles (center value of particle size distribution: 3.0 μm, manufactured by FUJIKURA KASEI CO., LTD.) with an average particle size of 1.5 μm and further the addition amount of the PMMA was set to 0.86 g/m$^2$.

[Production of Conductive Film Samples 10 and 11]

Samples 10 and 11 were produced in the same manner as sample 9, except that the addition amounts of the PMMA were changed to 0.43 g/m$^2$ or 0.21 g/m$^2$.

[Production of Conductive Film Sample 12]

Sample 12 was produced in the same manner as sample 1, except that the silicone oil was not added.

[Production of Conductive Film Sample 13]

Sample 13 was produced in the same manner as sample 2, except that the coating amount of gelatin in the emulsion layer was changed from 1 g/m$^2$ to 2 g/m$^2$.

[Production of Transparent Electromagnetic Wave-Shielding Filter]

The following hard coat liquid was coated on a mesh pattern of each conductive film sample using a #14 wire bar. After coating, the hard coat coating was dried at 80° C. for 3 minutes, and then the resultant hard coat film was cured by irradiation of UV with an irradiance level of 800 mJ/m$^2$.

Formula of Hard Coat Liquid

| Methyl ethyl ketone | 48 g |
| Pentaerythritol triacrylate mixture (trade name: KAYARAD PET-30, manufactured by Nippon Kayaku) | 40 g |
| Polymerization initiator (trade name: IRGACURE-127, manufactured by Ciba Specialty Chemicals) | 2 g |

(Evaluation)

Using each transparent electromagnetic wave-shielding filter thus produced, adhesion properties between the hard coat film and each sample were tested and evaluated according to a cross-cut method and its evaluation criterion described in JIS K-5600-5-6. As defined in JIS K-5600-5-6, the adhesion properties were valued at the integers of from 0 to 5 in terms of peeled area, provided that "the case where the edge of a cut is completely smooth and there is no peeling in any of the grid pattern" is 0. In this criterion, the number 5 indicates the largest peeled area. Regarding the evaluation of the condition of coated face, ○ indicates good condition of the coated face, x indicates bad condition of the coated face and Δ indicates the intermediate between ○ and x. The results are shown in Table 1.

TABLE 1

| No. | Compound contained in the emulsion layer | Content (mg/m$^2$) | Volume fraction (%) of compound contained in the emulsion layer with respect to total volume of emulsion layer | Result | Condition of coated face | Remarks |
| --- | --- | --- | --- | --- | --- | --- |
| 1 | Silicone oil | 100 | 13.4 | 0 | ○ | This invention |
| 2 | Silicone oil | 50 | 7.0 | 0 | ○ | This invention |
| 3 | Silicone oil | 25 | 3.6 | 3 | ○ | This invention |
| 4 | Silicone oil | 150 | 19.8 | 0 | Δ | This invention |

TABLE 1-continued

| No. | Compound contained in the emulsion layer | Content (mg/m$^2$) | Volume fraction (%) of compound contained in the emulsion layer with respect to total volume of emulsion layer | Result | Condition of coated face | Remarks |
|---|---|---|---|---|---|---|
| 5 | Silicone oil | 200 | 25.3 | 0 | x | This invention |
| 6 | Liquid paraffin | 100 | 14.7 | 0 | ○ | This invention |
| 7 | Liquid paraffin | 50 | 7.5 | 0 | ○ | This invention |
| 8 | Liquid paraffin | 25 | 3.8 | 3 | ○ | This invention |
| 9 | PMMA particles | 860 | 49 | 1 | ○ | This invention |
| 10 | PMMA particles | 430 | 33 | 2 | ○ | This invention |
| 11 | PMMA particles | 210 | 19 | 4 | ○ | This invention |
| 12 | — | — | — | 5 | ○ | Comparative example |
| 13 | Silicone oil | 50 | 3.5 | 3 | ○ | This invention |

As shown in the results of Table 1, the transparent electromagnetic wave-shielding filter of the comparative example (sample 12) in which the emulsion layer contained no compound soluble in a solvent (methyl ethyl ketone) contained in the hard coat liquid showed poor adhesion properties between the hard coat layer and the conductive film whereby a conspicuous peeling occurred. In contrast, it is understood that the transparent electromagnetic wave-shielding filters of the present invention (samples 1 to 11 and 13) in which the emulsion layer contained silicone oil, liquid paraffin or PMMA particles soluble in a solvent (methyl ethyl ketone) contained in the hard coat liquid showed improved adhesion properties between the hard coat layer and the conductive film.

In samples 4 and 5 in which an addition amount of silicone oil was increased, though there was no peeling, point defects occurred in the conductive layer. From these results, it is understood that it is necessary to adjust the addition amount of silicone oil depending on a PDP panel.

Further, samples were produced in the same manner as sample 1, except that the methyl ethyl ketone was changed to diethyl ketone, methyl isobutyl ketone, or cyclohexanone, respectively, and evaluated in the same manner as the above. As a result, it was found that there was almost no peeling, whereby these samples showed excellent adhesion properties between the hard coat layer and the conductive film.

Example 2

Preparation of Emulsion A

Solution 1:

| Water | 750 ml |
|---|---|
| Gelatin (phthalation-treated gelatin) | 20 g |
| Sodium chloride | 3 g |
| 1,3-Dimethylimidazolidine-2-thione | 20 mg |
| Sodium benzenethiosulfonate | 10 mg |
| Citric acid | 0.7 g |

Solution 2:

| Water | 300 ml |
|---|---|
| Silver nitrate | 150 g |

Solution 3:

| Water | 300 ml |
|---|---|
| Sodium chloride | 38 g |
| Potassium bromide | 32 g |
| Potassium hexachloroiridate (III) (0.005% in 20% aqueous KCl solution) | 5 ml |
| Ammonium hexachlororhodate (0.001% in 20% aqueous NaCl solution) | 7 ml |

The potassium hexachloroiridate (III) (0.005% in 20% aqueous KCl solution) and ammonium hexachlororhodate (0.001% in 20% aqueous NaCl solution) used in Solution 3 were prepared by dissolving complex powders thereof in a 20% aqueous solution of KCl and a 20% aqueous solution of NaCl, respectively, and heating the solutions at 40° C. for 120 minutes.

To solution 1, while the temperature and the pH of which were kept at 38° C., pH 4.5, solutions 2 and 3 (amounts corresponding to 90% of the respective solution amounts) were added simultaneously over a period of 20 minutes with being stirred. In this way, nucleus particles of 0.16 μm in size were formed. Subsequently, the following solutions 4 and 5 were added thereto over a period of 8 minutes, and the rests of the solutions 2 and 3 (amounts corresponding to 10% of the respective solution amounts) were further added thereto over a period of 2 minutes so as to cause the particles to grow up to 0.21 μm in size. Furthermore, 0.15 g of potassium iodide was added thereto, and the resultant was aged for 5 minutes to end the formation of the particles.

Solution 4:

| Water | 100 ml |
|---|---|
| Silver nitrate | 50 g |

Solution 5:

| Water | 100 ml |
|---|---|
| Sodium chloride | 13 g |
| Potassium bromide | 11 g |
| Potassium ferrocyanide | 5 mg |

Thereafter, washing with water by the flocculation method according to an ordinary method was conducted. Specifically, the temperature was lowered to 35° C., and the pH was lowered using sulfuric acid until the silver halide precipitated (the pH was in the range of 3.6±0.2).

About 3 L of the supernatant was then removed (first water washing). Further, 3 L of distilled water was added to the mixture, and sulfuric acid was added until silver halide precipitated. 3 L of the supernatant was removed again (second water washing). The procedure same as the second water washing was repeated once more (third water washing), and water-washing and desalting steps were thus completed.

The pH and pAg of the emulsion subjected to the washing and desalting were adjusted to 6.4 and 7.5, respectively. Thereto, 10 mg of sodium benzenethiosulfonate, 3 mg of sodium benzenethiosulfinate, 15 mg of sodium thiosulfate, and 10 mg of chloroauric acid were added, and the mixture was thus subjected to chemical sensitization to obtain the optimal sensitivity at 55° C. Then, 100 mg of 1,3,3a,7-tetrazaindene as a stabilizing agent, and 100 mg of Proxel (trade name, manufactured by ICI Co., Ltd.) as an antiseptic were added. Finally, a silver iodochlorobromide cubic particle emulsion containing 70 mol % of silver chloride and 0.08 mol % of silver iodide and having an average particle diameter of 0.22 μm and a coefficient of variation of 9% was obtained. The emulsion had finally a pH of 6.4, a pAg of 7.5, an electrical conductivity of 40 μS/m, a density of $1.4 \times 10^3$ kg/m$^3$, and a viscosity of 20 mPa·s.

(Production of Sample 14)

To the above-described Emulsion A, $5.7 \times 10^{-4}$ mol/molAg of a sensitizing dye (SD-1) was added so as to carry out spectral sensitization. Furthermore, $3.4 \times 10^{-4}$ mol/molAg of KBr and $8.0 \times 10^{-4}$ mol/molAg of Compound (Cpd-3) were added thereto and sufficiently mixed.

Subsequently, $1.2 \times 10^{-4}$ mol/molAg of 1,3,3a,7-tetrazaindene, $1.2 \times 10^{-2}$ mol/molAg of hydroquinone, $3.0 \times 10^{-4}$ mol/molAg of citric acid, 90 mg/m$^2$ of sodium 2,4-dichloro-6-hydroxy-1,3,5-triazine, 15% by mass relative to the gelatin of colloidal silica having a particle size of 10 μm, 50 mg/m$^2$ of aqueous latex (aqL-6), 100 mg/m$^2$ of a polyethylacrylate latex, 100 mg/m$^2$ of a latex copolymer of methyl acrylate, sodium 2-acrylamide-2-methylpropanesulfonate and 2-acetoxyethyl methacrylate (ratio by mass 88:5:7), 100 mg/m$^2$ of a core-shell type latex (core: styrene/butadiene copolymer (ratio by mass 37/63), shell: styrene/2-acetoxyethyl acrylate (ratio by mass 84/16), core/shell ratio=50/50), and Compound (Cpd-7) (4% by mass of relative to the gelatin) were added to the mixture. The pH of the coating liquid was adjusted to 5.6 using citric acid.

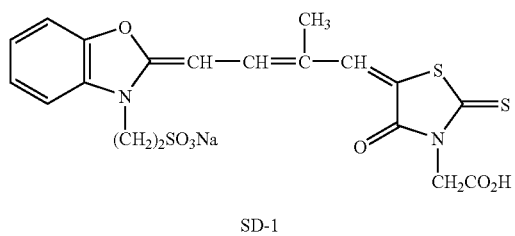

SD-1

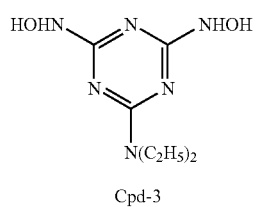

Cpd-3

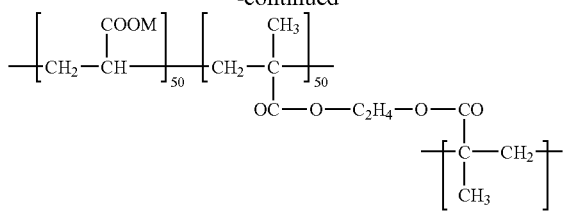

aqL-6

M = H or Na $CH_2$=$CHSO_2CH_2CONH$—
                                    |
                                    $(CH_2)_n$
                                    |
$CH_2$=$CHSO_2CH_2CONH$—

Cpd-7

(n = 2):(n = 3) = 3:1

As a support, polyethylene terephthalate (PET) film (thickness of 100 μm) was used. On the support, a layer satisfying the following conditions was formed, so that the ratio by volume of Ag to the binder (ratio by volume of Ag/GEL) in the emulsion layer was 2.4/1.0.

The emulsion layer-coating liquid prepared using emulsion A as described above was coated to set the coating amounts of Ag and gelatin to 16 g/m$^2$ and 0.83 g/m$^2$, respectively.

(Exposing/Developing Treatments)

Next, the sample prepared in the above was exposed to parallel light from a high-pressure mercury lamp as a light source through a lattice-form photomask capable of giving a developed silver image wherein lines and spaces were 5 μm and 295 μm, respectively (a photomask wherein lines and spaces were 295 μm and 5 μm (pitch: 300 μm), respectively, and the spaces were in a lattice form). The resultant was developed with the following developing solution, subjected further to developing treatment by use of a fixing solution (trade name: N3X-R for CN16X, manufactured by FUJIFILM CORPORATION), and rinsed with pure water. In this way, Sample 14 was obtained.

[Composition of Developing Solution]

1 liter of the developing solution contains the following compounds:

| | |
|---|---|
| Hydroquinone | 0.037 mol/L |
| N-Methylaminophenol | 0.016 mol/L |
| Sodium metaborate | 0.140 mol/L |
| Sodium hydroxide | 0.360 mol/L |
| Sodium bromide | 0.031 mol/L |
| Potassium metabisulfite | 0.187 mol/L |

(Calendering Treatment)

The sample subjected to the developing treatment as described above was calendered. The used calendering rolls were metallic rolls (each made of an iron core and hard chromium plating, roll diameter: 250 mm). While a linear pressure of 400 kgf/cm was applied thereto, the sample was passed between the rollers to measure the surface resistivity (unit: ohm(s)/sq, or Ω/).

The sample 14 was calendered at a pressure of 400 kgf/cm.

(Production of Sample 15)

Sample 15 was produced in the same manner as Sample 14, except that the following silicone oil (center value of particle size distribution: 0.18 μm) was added to the Emulsion A in an amount of 100 mg/m$^2$.

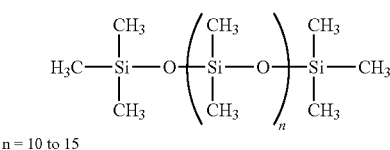

n = 10 to 15

(Production of Sample 16)

Sample 16 was produced in the same manner as Sample 14, except that the following liquid paraffin (center value of particle size distribution: 1.8 μm) was added to the Emulsion A in an amount of 100 mg/m².

—$(CH_2)_n$— ($n$=15 to 50)

(Production of Sample 17)

Sample 17 was produced in the same manner as Sample 14, except that PMMA particles (center value of particle size distribution: 3.0 μm) with an average particle size of 1.5 μm was added to the Emulsion A in an amount of 860 mg/m².

(Evaluation)

The evaluation for the samples 14 to 17 was conducted in the same manner as in Example 1. The results are shown in Table 2.

TABLE 2

| Sample No. | Compound contained in emulsion layer | Content (mg/m²) | Result | Condition of coated face | Remarks |
|---|---|---|---|---|---|
| 14 | — | — | 5 | ○ | Comparative example |
| 15 | Silicone oil | 100 | 0 | ○ | This invention |
| 16 | Liquid paraffin | 100 | 0 | ○ | This invention |
| 17 | PMMA particles | 860 | 0 | ○ | This invention |

Having described our invention as related to the present embodiments, it is our intention that the present invention not be limited by any of the details of the description, unless otherwise specified, but rather be construed broadly within its spirit and scope as set out in the accompanying claims.

What is claimed is:

1. A transparent electromagnetic wave-shielding filter, comprising a support, a conductive layer provided on the support, and a hard coat layer provided on the conductive layer,
    wherein the conductive layer is formed by subjecting an emulsion layer which contains a silver halide and a binder and is coated on the support, to exposure and developing process,
    wherein the hard coat layer is formed by coating a coating liquid for forming the hard coat layer with a solvent directly on the conductive layer,
    wherein the emulsion layer contains a compound soluble in the solvent of the coating liquid for forming the hard coat layer, and
    wherein the compound soluble in the solvent of the coating liquid for forming the hard coat layer is silicone oil or paraffinic oil.

2. The transparent electromagnetic wave-shielding filter according to claim 1, wherein the solvent is at least one solvent selected from the group consisting of ketones, esters and alcohols.

3. The transparent electromagnetic wave-shielding filter according to claim 1, wherein the content of the silicone oil or paraffinic oil is 6% by volume or more relative to the emulsion layer as a whole.

4. The transparent electromagnetic wave-shielding filter according to claim 1, wherein the content of the silicone oil or paraffinic oil in the emulsion layer is 20 to 300 mg/m².

5. The transparent electromagnetic wave-shielding filter according to claim 1, wherein center value of particle size distribution of the silicone oil or paraffinic oil is from 0.01 μm to 10 μm.

6. The transparent electromagnetic wave-shielding filter according to claim 1, wherein polymerization degree of polysiloxane contained as a component of the silicone oil is from 2 to 100.

7. The transparent electromagnetic wave-shielding filter according to claim 1, wherein the number of carbon atoms of paraffin-base hydrocarbon contained as a component of the paraffinic oil is from 2 to 1000.

8. The transparent electromagnetic wave-shielding filter according to claim 1, wherein the binder contained in the emulsion layer is gelatin.

9. A method of producing a transparent electromagnetic wave-shielding filter, comprising the steps of:
    forming a conductive layer by subjecting an emulsion layer which contains a silver halide and a binder and is coated on a support, to exposure and developing process; and
    forming a hard coat layer by coating a coating liquid for forming a hard coat layer with a solvent directly on the conductive layer,
    wherein the emulsion layer contains a compound soluble in the solvent of the coating liquid for forming the hard coat layer, and
    wherein the compound soluble in the solvent of the coating liquid for forming the hard coat layer is silicone oil or paraffinic oil.

10. A conductive film for a transparent electromagnetic wave-shielding filter, comprising a support and a conductive layer provided on the support,
    wherein the conductive film is used as a transparent electromagnetic wave-shielding filter by providing a hard coat layer on the conductive layer,
    wherein the conductive layer is formed by subjecting an emulsion layer which contains a silver halide and a binder and is coated on the support, to exposure and developing process,
    wherein the hard coat layer is formed by coating a coating liquid for forming the hard coat layer with a solvent directly on the conductive layer,
    wherein the emulsion layer contains a compound soluble in the solvent of the coating liquid for forming the hard coat layer, and
    wherein the compound soluble in the solvent of the coating liquid for forming the hard coat layer is silicone oil or paraffinic oil.

11. A transparent filter, comprising a support, a conductive layer provided on the support, and a hard coat layer provided on the conductive layer, wherein the conductive layer is formed by subjecting an emulsion layer which contains a silver halide and a binder and is coated on the support, to exposure and developing process, wherein the hard coat layer is formed by coating a coating liquid for forming the hard coat layer with a solvent directly on the conductive layer, wherein the emulsion layer contains a compound soluble in the solvent of the coating liquid for forming the hard coat layer, and wherein the compound soluble in the solvent of the coating liquid for forming the hard coat layer is silicone oil or paraffinic oil.

12. A conductive film, comprising a support and a conductive layer provided on the support, wherein the conductive film is used after providing a hard coat layer on the conductive layer, wherein the conductive layer is formed by subjecting an emulsion layer which contains a silver halide and a binder and is coated on the support, to exposure and developing process, wherein the hard coat layer is formed by coating a coating liquid for forming the hard coat layer with a solvent directly on the conductive layer, wherein the emulsion layer contains a compound soluble in the solvent of the coating liquid for forming the hard coat layer, and wherein the compound soluble in the solvent of the coating liquid for forming the hard coat layer is silicone oil or paraffinic oil.

13. The method of producing a transparent electromagnetic wave-shielding filter according to claim 9, wherein the solvent is at least one solvent selected from the group consisting of ketones, esters and alcohols.

14. The conductive film for a transparent electromagnetic wave-shielding filter according to claim 10, wherein the solvent is at least one solvent selected from the group consisting of ketones, esters and alcohols.

15. The transparent filter according to claim 11, wherein the solvent is at least one solvent selected from the group consisting of ketones, esters and alcohols.

16. The conductive film according to claim 12, wherein the solvent is at least one solvent selected from the group consisting of ketones, esters and alcohols.

17. The method of producing a transparent electromagnetic wave-shielding filter according to claim 9, wherein the content of the silicone oil or paraffinic oil is 6% by volume or more relative to the emulsion layer as a whole.

18. The conductive film for a transparent electromagnetic wave-shielding filter according to claim 10, wherein the content of the silicone oil or paraffinic oil is 6% by volume or more relative to the emulsion layer as a whole.

19. The transparent filter according to claim 11, wherein the content of the silicone oil or paraffinic oil is 6% by volume or more relative to the emulsion layer as a whole.

20. The conductive film according to claim 12, wherein the content of the silicone oil or paraffinic oil is 6% by volume or more relative to the emulsion layer as a whole.

\* \* \* \* \*